United States Patent [19]
Borel et al.

[11] 3,936,861
[45] *Feb. 3, 1976

[54] CHARGE-COUPLED DEVICE AND METHOD OF FABRICATION OF THE DEVICE

[75] Inventors: Joseph Borel, Echirolles; Jacques Lacour, Grenoble; Gerard Merckel, La Tronche, all of France

[73] Assignee: Commissariat a l'Energie Atomique, Paris, France

[ * ] Notice: The portion of the term of this patent subsequent to Aug. 13, 1991, has been disclaimed.

[22] Filed: Mar. 12, 1974

[21] Appl. No.: 450,433

Related U.S. Application Data

[63] Continuation of Ser. No. 217,595, Jan. 13, 1972, abandoned.

[30] Foreign Application Priority Data
Jan. 14, 1971  France .............................. 71.01182

[52] U.S. Cl. ................................................. 357/24
[51] Int. Cl.² .......................................... H01L 29/78
[58] Field of Search ........................................ 357/24

Primary Examiner—Martin H. Edlow
Attorney, Agent, or Firm—Cameron, Kerkam, Sutton, Stowell & Stowell

[57] ABSTRACT

A charge-coupled device in which the storage and tranfer of information in the form of charges consisting of minority carriers are carried out with only two clocks. The device comprises a doped semiconductor substrate coated with an insulating thin film carrying a linear series of conductive electrodes. A variably doped surface region of the substrate creates a potential barrier for the minority carriers upstream of a charge-storage region. The same value of potential is fixed respectively for the odd-numbered electrodes and for the even-numbered electrodes, these values being modified in cycles so as to transfer the charge from each alternate electrode to one of the adjacent electrodes.

A method of fabrication of the device consists in forming an insulating film and an assembly of conductive electrodes on a semiconductor substrate and in ion implantation by means of an ion beam in order to increase the doping of the substrate beneath one edge of the electrodes.

2 Claims, 9 Drawing Figures

CHARGE-COUPLED DEVICE AND METHOD OF FABRICATION OF THE DEVICE

This is a continuation of application Ser. No. 217,595, filed Jan. 13, 1972, now abandoned.

This invention relates to a charge-coupled device which is primarily although not exclusively intended to be employed as a shift register, delay line and scanning retina.

Charge-coupled devices form part of integrated systems comprising a doped semiconductor substrate of the n or p type covered with an insulating thin film having a thickness of the order of 0.1 micron, and conductive electrodes uniformly disposed on the film. Systems of this type which are in most common use are designated by the abbreviation MOS (metal-metal oxide-semiconductor) since, in the majority of cases, they are constituted by a semiconductor substrate (n-type silicon, for example), a thin film of oxide of the semiconductor ($SiO_2$ in the case just mentioned) and metallic electrodes (aluminum, for example). However, it must be understood that the abbreviation MOS as employed in this description can designate a system which does not correspond to this arrangement and in which, for example, the insulating film is not an oxide, especially if it is at least partially a nitride (MIS or metal-insulator-semiconductor structures), or in which the electrodes are formed of very heavily doped silicon, for example.

The charges which are stored and displaced in charge-coupled MOS devices are constituted by minority carriers retained by potential wells formed beneath some of the electrodes which are brought to suitable potentials. In order to transfer charges from one electrode to the next, the potential wells are displaced from one electrode to another, the direction of displacement in charge-coupled devices of the type employed heretofore (which will be described below) being established by making provision for an additional electrode.

Compared with conventional integrated circuits of the bipolar transistor or field-effect transistor type, charge-coupled MOS devices have the advantage of greater compactness and especially of a manufacturing process involving a much smaller number of steps. On the other hand, as will become apparent later, these devices constitute a dynamic memory in which the information storage time is limited. Moreover, the transfer of information made it necessary up to the present time to employ three clocks connected to the electrodes by means of circuits which cross one another, this arrangement being contrary to simplicity of manufacture and use.

The aim of the present invention is to provide charge-coupled devices which meet practical requirements more effectively than those existing up to the present time, particularly insofar as they permit easier manufacture and use by reason of the fact that storage and transfer of charges call for the use of only two clocks.

To this end, a device according to a first aspect of the invention comprises a doped semiconductor substrate coated with an insulating thin film which carries at least one assembly of $2a$ of conductive electrodes ($a$ being a whole number) which are disposed in succession along an axis, said support having a doped surface region beneath said assembly and the doping of said region being intended to vary in such a manner that a potential barrier for the minority carriers is created upstream with respect to the direction of transfer of said charges, of a charge-storage region in approximately coincident relation with the region which is subjacent to one of the electrodes, means for injecting or not a predetermined charge of minority carriers beneath at least the first electrode, and means for establishing the same value of potential for all the odd-numbered electrodes as well as the same value of potential for all the even-numbered electrodes and for modifying these values in cycles each of which causes the transfer of the charge from each alternate electrode to one of the adjacent electrodes whose potential barrier is located on the same side as the electrode from which the charge is derived.

The distribution of the doping within the surface region subjacent to all the electrodes results in the existence of a number of threshold voltages within the surface portion of the substrate and correlatively, at the time of transfer, in the appearance of an electric field which is parallel to the surface of the support and the lines of force of which are directed from one electrode to the adjacent electrode solely in the direction of said axis.

The expression "threshold voltage" designates and will continue to designate hereinafter the minimum voltage which is such that, if it is applied to an electrode over a sufficiently long period of time, it results in the accumulation beneath said electrode of a certain quantity of charges of opposite type to those of the substrate.

In a first embodiment of the invention, said variation in doping of the surface region is carried out by forming beneath each electrode a surface region which is more heavily doped beneath the upstream edge of each electrode than is the case beneath the remainder of the electrode.

In a second embodiment of the invention, said substrate is provided between the electrodes with a surface region in which the presence of the donor or acceptor dopant (such as phosphorus, for example) is at least partially compensated by the presence of an acceptor or donor (boron, for example).

In order to ensure effective transfer of the charges from a memory cell to the following cell, the first embodiment calls for relatively high control voltages; in the second embodiment, the charges are stored at least partially beneath the interelectrode spaces and the number of charges is very difficult to control. Although it is wholly feasible to give practical effect to the first embodiment, the invention preferably proposes a device which makes conjoint use of the two arrangements previously described and which is free from the defects just mentioned. This is the case in the definition which will be given hereinafter:

A device according to a further aspect of the invention and permitting the transfer of binary information in the form of charges comprises a doped semiconductor substrate coated with an insulating thin film carrying at least one assembly of $2a$ conductive electrodes having successively an even and odd-numbered order ($a$ being a whole number) and disposed in succession along an axis, said semiconductor being provided between the electrodes with a more lightly doped surface region and beneath each electrode, and beneath the edge located on the same side of each of these electrodes, with a surface region which is more heavily doped than the remainder of the semiconductor substrate which is subjacent to the electrodes, the lightly doped region, the heavily doped region and the remainder of the semiconductor substrate which is subjacent to the electrodes having threshold voltages equal respectively to $V_{S1}$, $V_{S3}$ and $V_{S2}$, means for injecting into the semiconductor binary information in the form of charges of minority carriers, and means for storing and circulating the binary information along the succession of electrodes, comprising a first time base for applying successively to the odd-numbered electrodes a storage voltage $V_2$ ($V_2$ being higher than $V_{S2}$), a bias voltage $V_2$, $V_1$ ($V_1$ being lower than $V_{S2}$), a transfer voltage $V_3$ ($V_3$ being higher than $V_{S3}$) constituting a cycle of transition from one odd-numbered electrode to the following odd-numbered electrode, that is to say from a memory cell to the second memory cell next following, a second time base for applying at the same time to the even-numbered electrodes the respective voltages corresponding to the same cycle of transition from an odd-numbered electrode to the following odd-numbered electrode $V_1$, $V_3$, $V_2$, $V_2$, etc..., said charges of minority carriers being localized at the time of injection and storage, in the case of each group of two electrodes, beneath the electrode which is brought to the potential $V_2$.

The invention further proposes a method of fabrication of charge-coupled devices in which, after having formed on a semiconductor substrate an insulating film and a succession of conductive electrodes, the doping of the semiconductor beneath one of the edges of the electrodes is increased by ion implantation by means of an ion beam which is oblique with respect to the substrate and/or the addition of ions in the surface regions located between the electrodes is compensated by ion implantation by means of a beam of an acceptor if the doping agent is the donor, of a donor if the doping agent is the acceptor, said beam being perpendicular to the substrate.

A clearer understanding of the invention will be gained from the following description of a device constituting one embodiment which is given by way of non-limitative example and of a comparison with a device according to the prior art. Reference will be made to the accompanying drawings, in which:

FIGS. 1a, 1b and 1c are schematic diagrams in which the essential elements of the device according to the prior art are shown in cross-section on a plane at right angles to the substrate which passes through the electrodes and which show in dashed lines the space charge zone (namely the zone which is devoid of free carriers at the time of storage beneath the electrodes 1, 4,..., 3a + 1 (FIG. 1a), of transfer (FIG. 1b) and of storage beneath the electrodes 2, 5, ..., 3a + 2 (FIG. 1c);

FIGS. 2a, 2b and 2c which are similar to FIGS. 1 show diagrammatically in dashed lines the space charge zones respectively at the time of storage beneath the odd-numbered electrodes 1, 3, ... (FIG. 2a), of transfer (FIG. 2b) and of storage beneath the even-numbered electrodes 2, 4 (FIG. 2c) of the device according to the invention;

Figure 1A:
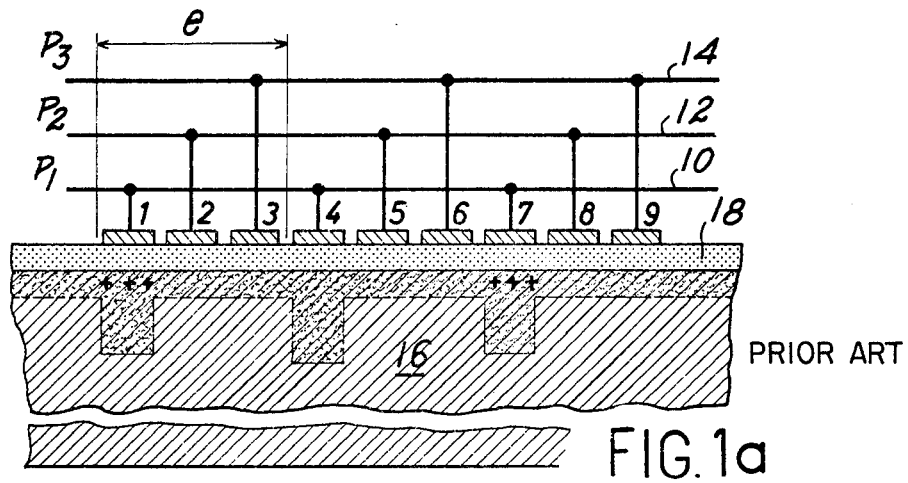
Figure 1B:
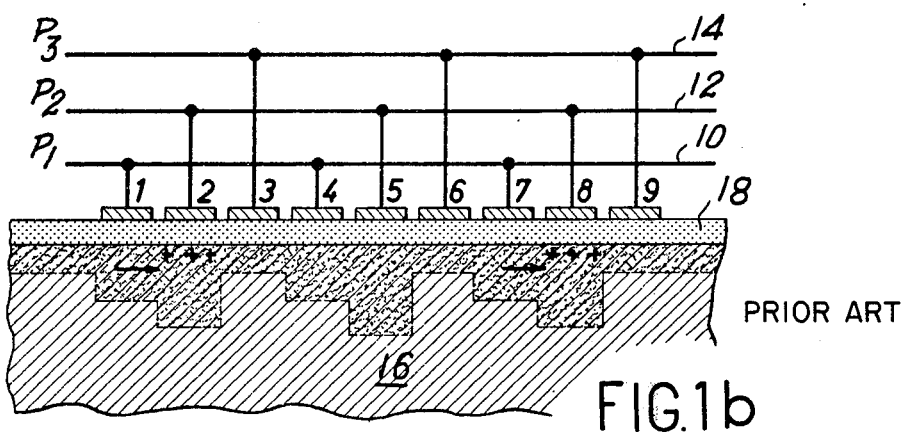
Figure 1C:
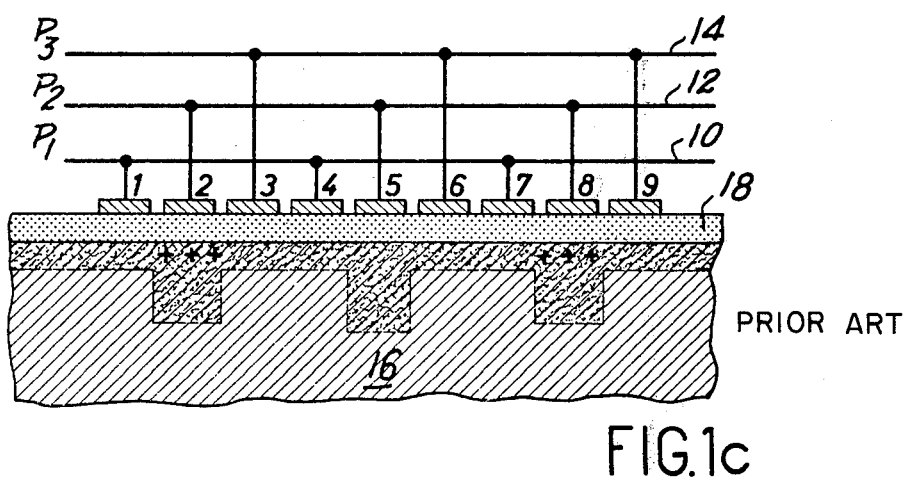

The charge-coupled device in accordance with the prior art, a portion of which is illustrated diagrammatically in FIGS. 1a, 1b and 1c, comprises a semiconductor substrate 16 consisting of n-type silicon. This substrate has a thickness of a few hundred microns and carries an insulating film 18 of silicon oxide, the thickness of which is of the order of 0.1 micron. Electrodes numbered 1, 2, 3, ..., 9 are placed in succession on the oxide along a common axis and can be constituted in a conventional manner by deposition and photoetching. By way of example, these electrodes can be formed of aluminum. A series of parallel lines of electrodes which may be either rectangular or square, for example, and forming a matrix lattice can be formed in such manner as to constitute a number of shift registers or a retina, for example.

The electrodes can be considered as constituting three groups, the electrodes of each group being deducted from the electrodes of another group by translation along one pitch of the electrode lattice. Surface conductors 10, 12 and 14 interconnect all the electrodes of one group. Clocks which are not illustrated serve to modify in synchronism the potential $P_1$ applied to the conductor 10, the potential $P_2$ applied to the conductor 12 and the potential $P_3$ applied to the conductor 14. The device further comprises means for injecting positive charges at least beneath the first electrode. In the case illustrated in FIG. 1a (corresponding to storage), charges are shown beneath the electrodes 1 and 7 whereas no charge is present beneath the electrode 4, in which the semiconductor material 16 is in a state of deep depletion. The logic level 1 can arbitrarily be assigned to the presence of charges and the logic level 0 can be assigned to the absence of charge beneath an electrode having the order $3a + 1$, wherein $a$ is either a positive integer or zero.

Clocks connected to conductors 10, 12 and 14 serve to give to the potentials $P_1$, $P_2$ and $P_3$ measured with respect to the substrate three levels $V_1$, $V_2$ and $V_3$ which are designated respectively quiescent or bias level, storage level and transfer level. The level $V_1$ is chosen of sufficiently low value to ensure that the semiconductor 16 is scarcely depleted in carriers beneath an electrode which is brought to this potential. The level $V_2$ which is higher at absolute value than the level $V_1$ is chosen to ensure that, if there are minority carriers in proximity, said carriers are attracted beneath this electrode (case of electrodes 1 and 7 in FIG. 1a) and that there is a deep depletion beneath the electrode if there are no minority carriers (electrode 4 in FIG. 1a). This last-mentioned condition evidently makes it essential to ensure that $V_2$ is higher at absolute value than the threshold voltage corresponding to the semiconductor. Finally, the level $V_3$ which is higher at absolute value than the level $V_2$ is intended to cause the transfer of charges beneath the electrode which is brought to this level from the adjacent electrodes.

During storages of information beneath the electrodes having the order $3a + 1$ (case of FIG. 1a), the clocks give the values $V_2$, $V_1$ and $V_1$ to the potentials $P_1$, $P_2$ and $P_3$ respectively. In order to initiate transfer beneath the electrodes having the order $3a + 2$, the clocks bring the potentials $P_1$, $P_2$ and $P_3$ to the levels $V_2$ (storage), $V_3$ (transfer) and $V_1$ (quiescent state) or, in other words, increase the absolute value of potential of the electrodes having the order $3a + 2$. The charges move from the electrodes having a voltage $V_2$ beneath the electrodes having a voltage $V_3$ (FIG. 1b). Finally, the clocks bring the potentials $P_1$, $P_2$ and $P_3$ to the respective levels $V_1$, $V_2$ and $V_1$ (FIG. 1c), which corresponds to the same distribution as in FIG. 1a, as displaced by one electrode.

The maximum frequency of operation is limited by the time of transit of charges from one electrode to the next and the minimum frequency is limited by the supply of zones in a state of deep depletion (electrode 4 in FIG. 1a) by heat generation within the space charge zones which destroys the information by eliminating the stored minority carriers; this supply can be sloweddown by employing material having a forbidden band which is wider than that of silicon.

The device which has just been described calls for three clocks and consequently for connections which are difficult to establish in the case of integrated circuits. Moreover, storage of binary information requires an overall width $e$ (FIG. 1a) corresponding to three electrodes. In order to orient the charge transfer, it is in fact necessary (by reason of the homogeneous character of the semiconductor substrate) to ensure that only one of the electrodes adjacent to the particular electrode from which the charges are to be displaced is brought to the voltage $V_3$.

Figure 2A:
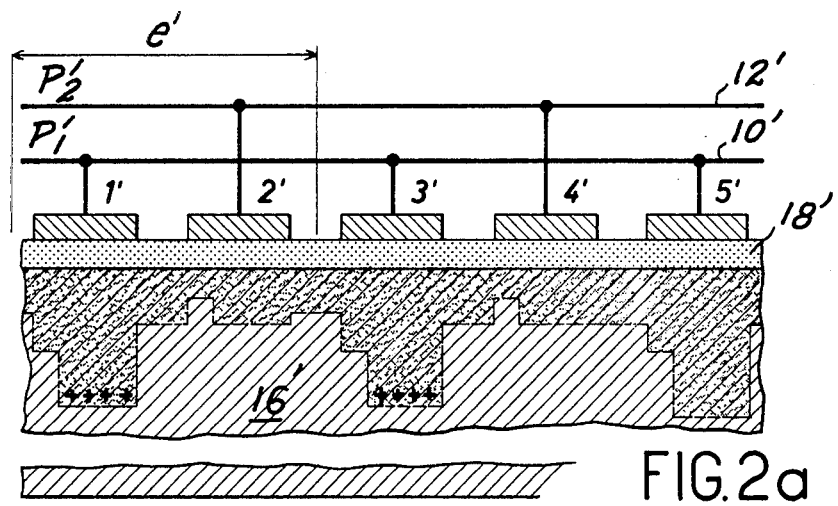
Figure 2B:
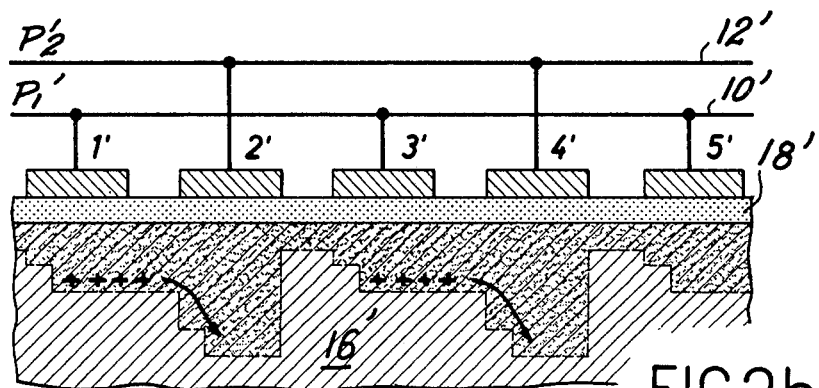
Figure 2C:
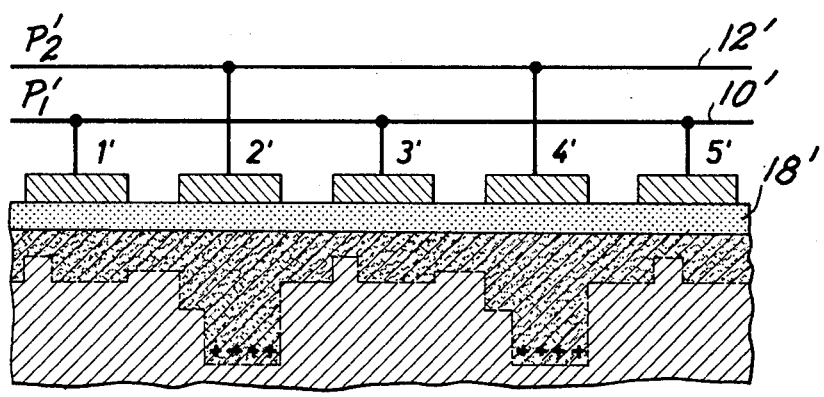
Figure 3:
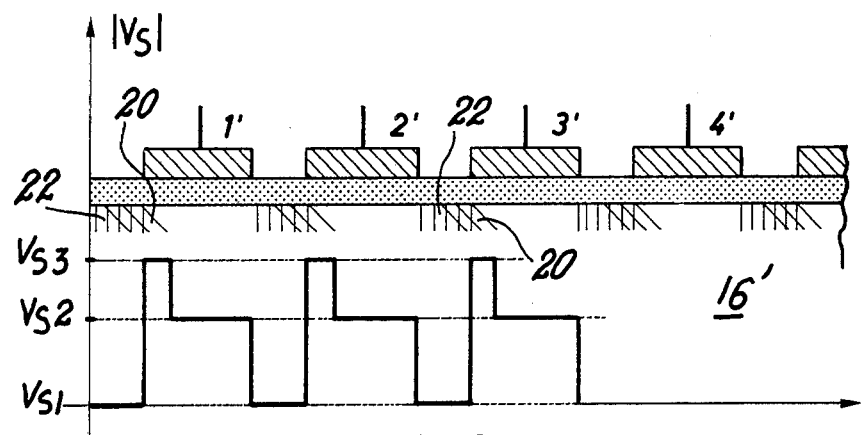
FIG. 3 is a view to the same scale of length as in FIGS. 2 showing the variations in the threshold voltage $V_S$ along the substrate.

The device according to the invention as illustrated in FIGS. 2 and 3 makes is possible to reduce the overall width for storage of binary information to the length of two electrodes and therefore correlatively to increase the density of information while making use of only two clocks. To this end, the device of FIGS. 2 and 3 makes use of a substrate which is no longer doped in a homogeneous manner. Whereas the mass of the substrate 16' is n-type silicon, for example, the surface regions 20 of the semiconductor beneath the edge located on the same side of all the electrodes 1', 2', 3', ... are more heavily doped so as to increase their threshold voltage. For example, if $V_{S2}$ designates the threshold voltage in the case of the mass of the Si-n semiconductor and $V_{S3}$ designates the threshold voltage in the case of the heavily doped semiconductor (which will be designated as Si-n$^{++}$, we will have $V_{S2} > V_{S2}$. In the embodiment which is illustrated in FIGS. 2 and 3, the surface region of the semiconductor between the electrodes is additionally doped with an impurity having a type opposite to that of the mass of the semiconductor (acceptor in the case in which the substrate is n-type silicon). A partial compensation is thus achieved and this brings the threshold voltage to a value $V_{S1}$ which is lower at absolute value than $V_{S2}$ and $V_{S3}$. As will be seen hereinafter, the existence of this compensated zone 22 makes the transfer of charges from one electrode to another more rapid and more efficient and orients said transfer.

The electrodes 1', 2', 3', etc... of the device of FIGS. 2 and 3 are in an even number 2a. The odd-numbered electrodes are connected to a first clock (not illustrated) and this latter brings them to a potential $P'_1$ which is capable of assuming three levels. Similarly, the even-numbered electrodes are connected to a second clock and brought by this latter to a potential $P'_2$ which is capable of assuming the same three levels. The space charge zone, the limit of which is represented diagrammatically in dashed lines in FIG. 2a, corresponds to the storage of information beneath the odd-numbered electrodes: the charges which are constituted by minority carriers (namely holes since the material is n-type silicon) are retained beneath the electrodes 1' and 3' which are brought by the conductor 10' to a potential $V_2$, this latter being higher at absolute value than $V_{S2}$. The semiconductor is in a state of deep depletion beneath the electrode 5', also brought to the potential $V_2$, beneath which there is no charge. The even-numbered electrodes are maintained by the conductor 12' at a low quiescent voltage $V_1$.

The directional transfer of charges takes place when the clocks bring the potential $P'_2$ to a value $V_3$ which is higher at absolute value than $V_{S3}$ while maintaining $P'_1$ at the value $V_2$. The boundary of the space charge region beneath the electrodes takes the shape illustrated in FIG. 2b. There appears an electric field in which the lines of force are parallel to the surface of the semiconductor material and which tends to transfer the charges rapidly and totally from the odd-numbered electrodes to beneath the even-numbered electrodes: the directional effect produced by the differences in doping appears in FIG. 2b.

Finally a storage again takes place, this time beneath the even-numbered electrodes, when the clocks restore the potential $P'_2$ to the value $V_2$ and the potential $P'_1$ to the value $V_1$ (FIG. 2c). It is apparent in the case illustrated in FIGS. 2 and 3 that the overall width $e'$ of a binary information corresponds only to the length of two electrodes.

The device which has just been described permits the same applications as the charge-coupled devices of the prior art with a greater density of information: in particular, the device can be employed as a dynamic memory with electrical reading or as a photosensitive element (optical memory or artificial retina). In both cases, reading is carried out in a serial manner. Direct optical access across the substrate can be facilitated by making use of a composite substrate consisting of a layer of silicon on corundum.

In both cases, the detection circuits associated with the last electrode can comprise in known manner a reverse-biased p-n junction or surface barrier diode. The introduction of information when this latter is electrical can also be carried out in known manner by means of similar elements such as a diffused-junction diode, a surface-barrier diode (Schottky diode) or a deep-depletion MOS capacitor.

In regard to the circuit for introduction and reading information, reference may be made to the articles which appeared in the "Bell System Technical Journal Briefs", April, 1970, ps. 587 to 600 and in "Electronics," May, 1970, 11, ps. 112 to 119.

Figure 4:
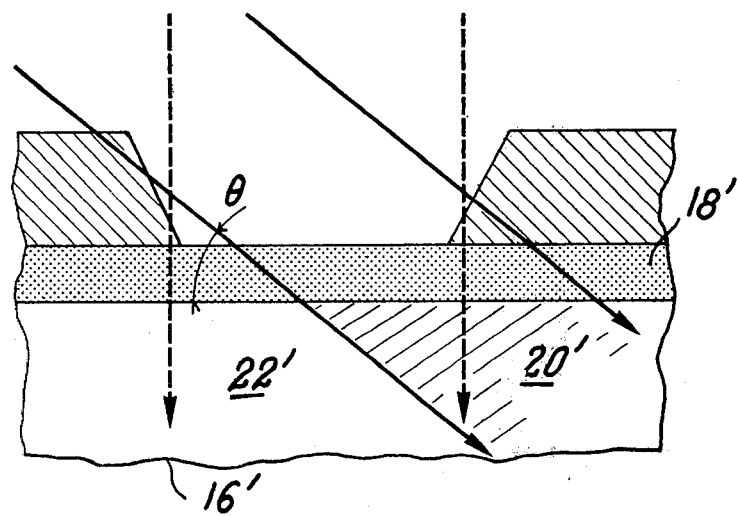
FIG. 4 shows diagrammatically an additional method of doping of the substrate by ion implantation beneath one edge of each electrode.

Heterogeneous doping of the surface region of the semiconductor can be carried out in particular by utilizing ion beam implantation as illustrated in FIG. 4. Once the insulating layer 18' and the metallic electrodes have been formed by means of a wholly conventional method, additional doping of the rgions 20 is performed by means of an ion beam which is inclined to the surface. Subsequently, in the event that it should prove necessary to achieve further enhancement of charge transfer, compensation of the regions 22' is carried out by means of an ion beam directed in this case at right angles to the surface.

By way of example, n-type silicon can be employed as semiconductor and the implantation can be carried out by making use of a phosphorus ion beam having a mean energy of 180 keV. The angle $\theta$ of attack by the beam is not critical. In the case of the usual electrode thicknesses, the angle $\theta$ can as a rule be comprised between 10° and 30°.

Figure 5:
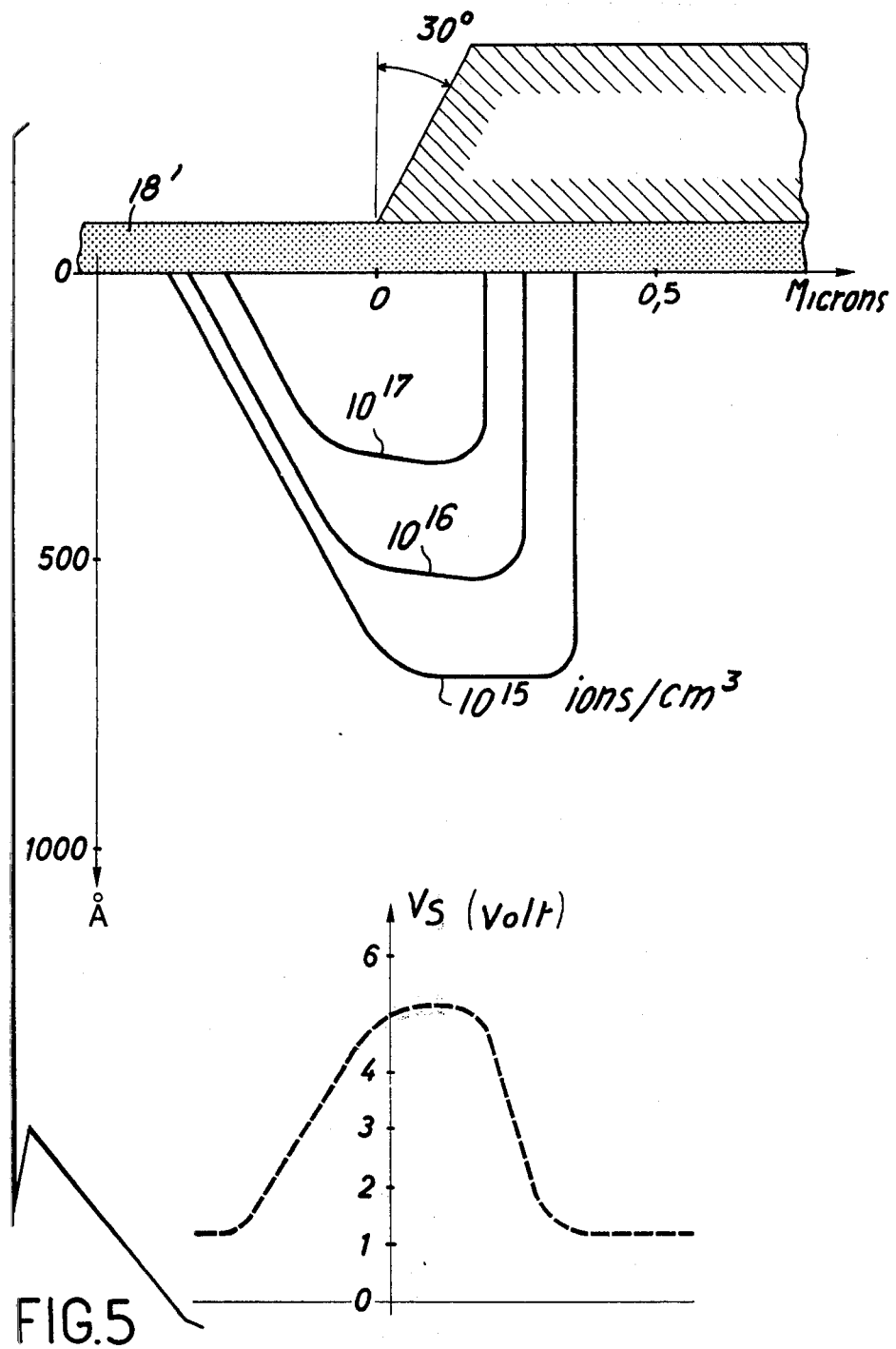
FIG. 5 is a diagram showing a distribution of the concentrations obtained by the method illustrated in FIG. 4.

FIG. 5 shows an example of deep doping which can be carried out in n-type silicon coated with an oxide film 18' having a thickness of 500 A and with aluminum electrodes having a thickness of 1 micron, the edges of which are inclined at an angle of 30°. By using a beam made up of phosphorus ions of 180 KeV energy and directed onto the substrate at an angle of 17°11', there has thus been obtained the distribution shown in FIG. 5 in which the curves indicate the limits of the zones in which the doping is respectively higher than $10^{15}$, $10^{16}$ and $10^{17}$ ions per cm$^3$. For the sake of greater clarity, the height scale adopted is different on the one hand in the case of the oxide film and electrodes and on the other hand in the case of the substrate. There is shown in the same figure in dashed lines the variation in threshold voltage $V_S$ along the substrate: an increase in said voltage $V_S$ outside the region which is covered by the electrodes can then be eliminated by addition of boron by means of an ion beam which is perpendicular to the substrate (in dashed lines in FIG. 4), in accordance with a conventional process.

The invention is obviously not limited to the particular embodiments which have been illustrated and described by way of example and it must be understood that the scope of this patent extends to any alternative forms which remain within the definition of equivalent means.

It is important to note in particular that the charge-coupled device in accordance with the invention can be constructed with semiconductors of the forbidden broad-band type such as compound semiconductors, for example, which permits much longer times of rebalancing of the inversion layer and therefore enables the device to operate at lower frequencies.

What we claim is:

1. A charge-coupled device comprising, a doped semi-conductor substrate coated with an insulating thin film carrying at least one assembly 2a of conductive electrodes which are disposed in succession along one axis, said substrate having a doped surface region beneath said assembly, a surface region beneath each electrode more heavily doped beneath the upstream edge of the electrode than beneath the remainder of said electrode whereby a potential barrier for the minority carriers is created upstream, with respect to the direction of transfer of said carriers, of a charge-storage region in approximately coincident relation with the region which is subjacent to one of the electrodes, means for injecting a predetermined charge of minority carrier beneath at least the first electrode, and means for establishing the same value of potential for all the odd-numbered electrodes as well as the same value of potential for all the even-numbered electrodes and for modifying these values in cycles each of which causes the transfer of the carrier from each alternate electrode to one of the adjacent electrodes whose potential barrier is located on the same side as the electrode from which the charge is derived.

2. A device according to claim 1, wherein the transfer means apply successively to two successive electrodes:

in a first stage, a storage voltage $V_2$ capable of retaining the charge which may be present beneath the first of the two electrodes and a bias voltage $V_1$ which is lower than $V_2$, in a second stage, the voltage $V_2$ and a transfer voltage $V_3$ higher than $V_2$, and in a first stage of a following cycle, voltages $V_1$ and $V_2$.

* * * * *